Oct. 31, 1961 R. MONROE, JR., ET AL 3,006,318

APPARATUS FOR APPLYING SOLDER COATINGS TO SURFACES

Filed March 26, 1958 3 Sheets-Sheet 1

INVENTORS
Raymond Monroe, Jr.
Tom E. Moore,
BY
H. J. Winegar
ATTORNEY

Oct. 31, 1961 R. MONROE, JR., ET AL 3,006,318

APPARATUS FOR APPLYING SOLDER COATINGS TO SURFACES

Filed March 26, 1958 3 Sheets-Sheet 2

INVENTORS

Raymond Monroe, Jr.

Tom E. Moore,

BY H. J. Winegar

ATTORNEY

APPARATUS FOR APPLYING SOLDER COATINGS TO SURFACES

Filed March 26, 1958 3 Sheets-Sheet 3

INVENTORS
Raymond Monroe, Jr.
Tom E. Moore,
BY
H. J. Winegar
ATTORNEY 3,006,318

APPARATUS FOR APPLYING SOLDER COATINGS TO SURFACES

Raymond Monroe, Jr., Greensboro, N.C., and Tom E. Moore, Cumberland, Va., assignors to Western Electric Company, Incorporated, New York, N.Y., a corporation of New York Filed Mar. 26, 1958, Ser. No. 724,062
7 Claims. (Cl. 118—217)

This invention relates to apparatus for applying solder coatings to surfaces and more particularly to apparatus for applying solder to solderable metal surfaces of printed circuits mounted in insulation boards.

It has been possible to reduce greatly the over-all size of electrical assemblies through the use of printed wiring in conjunction with transistors, diodes, and other miniaturized components. For example, assemblies such as terminal boards have interconnecting straps printed on the boards. Other assemblies use printed circuit boards as a chassis on which apparatus is mounted on both sides, and the entire assembly is plugged into a jack.

The reduction in size of assemblies has created difficulties in soldering operations inasmuch as printed circuits afford only small masses of circuit material and small surface areas to which solder connections may be made. When the heat required for soldering is applied to a portion of the circuit to which a component is to be fixed, the small mass of circuit material present at the point of connection oxidizes rapidly. Also, it is difficult to apply solder directly by heat to printed circuits in fastening components to the circuits without breakdown of the customary adhesive bond which holds together the printed wiring and the board on which the wiring is mounted.

An object of this invention is to provide new and improved apparatus for applying solder coatings to surfaces.

A further object of the present invention is to provide a new and improved apparatus for applying solder to solderable metal surfaces of printed circuits mounted on insulation boards.

Another object is the provision of a machine for applying a coating of solder to a printed circuit mounted on a board, which machine adjusts automatically to process boards of varying thickness, and to apply solder coatings of smooth surfaces and uniform thicknesses to the surfaces of the printed circuits mounted on the board.

A machine illustrating certain features of the invention may include a pair of coating rollers, a pair of tanks containing baths of liquid coating material, means for mounting said rollers rotatably and translatably in longitudinal opposition, each of said rollers being positioned above a corresponding tank with portions of the roller projecting into the tank and immersed in the coating bath, and means for urging the rollers toward each other yieldably to cause the rollers to contact surfaces on opposite sides of sheets passed therebetween so that the rollers adjust automatically for the different thicknesses of the sheets.

Other objects and advantages of the invention will become apparent by reference to the following detailed description of apparatus forming a specific embodiment, when read in conjunction with the accompanying drawings, in which.

Figure 1:
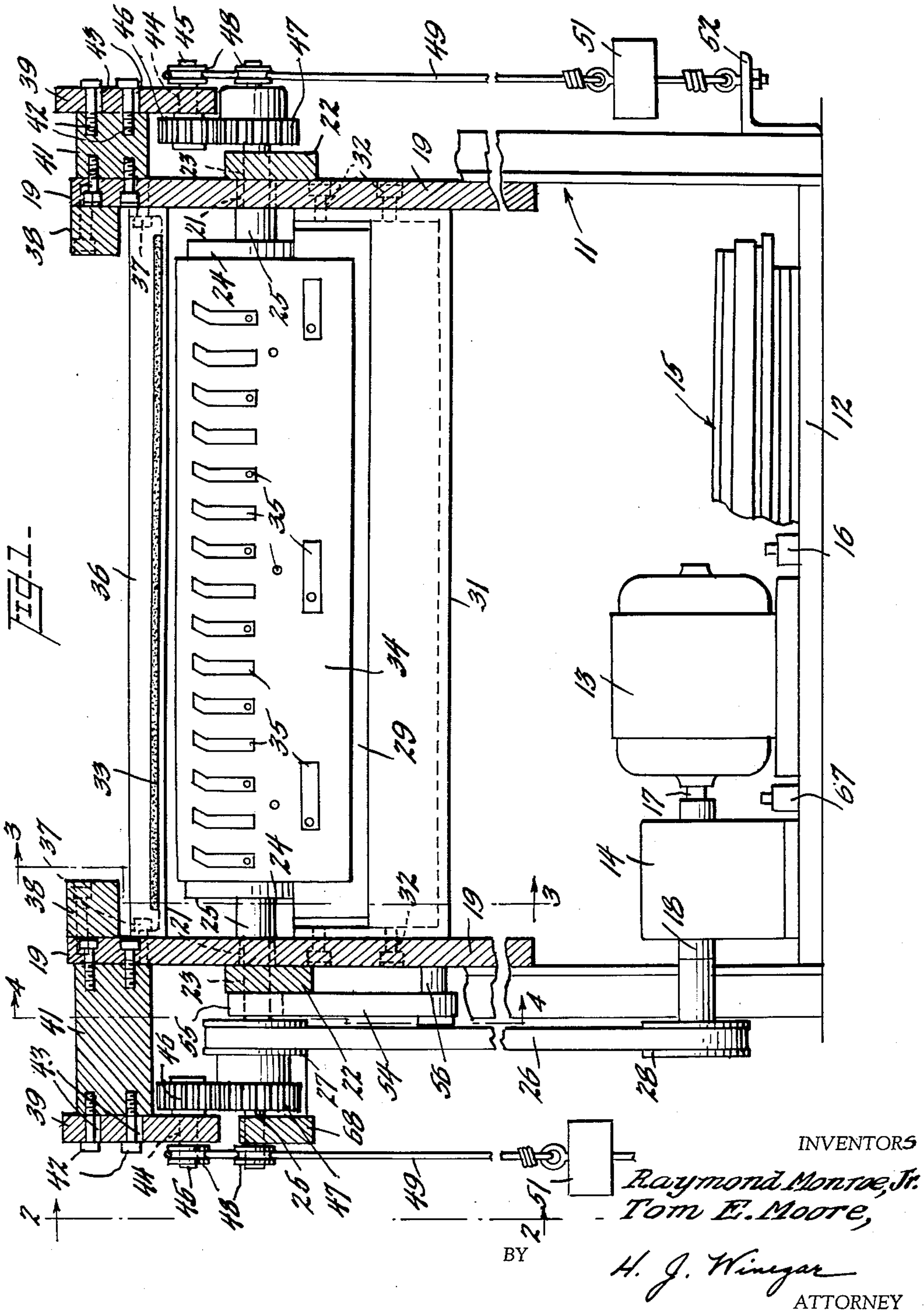
FIG. 1 is a vertical sectional view of the apparatus taken along the longitudinal axis thereof showing a printed wire board passing vertically a roller of the apparatus.

Referring now to the drawings, and in particular to FIG. 1, apparatus illustrating a specific embodiment of the invention includes a legged stand, designated generally by the numeral 11, having a base plate 12 engaged to the stand so as to provide a horizontal shelf surface. Mounted on the base plate 12 is a motor 13 and a gear housing 14 in which are contained conventional speed-reducing gears. A number of printed wire boards 15—15, having different thicknesses, are shown stacked on the base plate 12. These printed wire boards having been solder coated by the apparatus, are positioned for removal to another machine which is not a part of this invention for subsequent fabrication and assembly operations.

The motor 13 is controlled by a variable speed control device, such as a rheostat 16 mounted on the plate 12, which is used to regulate the output speed of a shaft 17 of the motor 13. The output speed of motor 13 may be varied in accordance with the nature of the material which is to be soldered, the fluxes used, and the type of solder to be applied. An output shaft 18 is shown connected to the gear housing 14 to complete a gear train drive from the motor shaft 17 through the gears contained in the housing 14.

Figure 2:
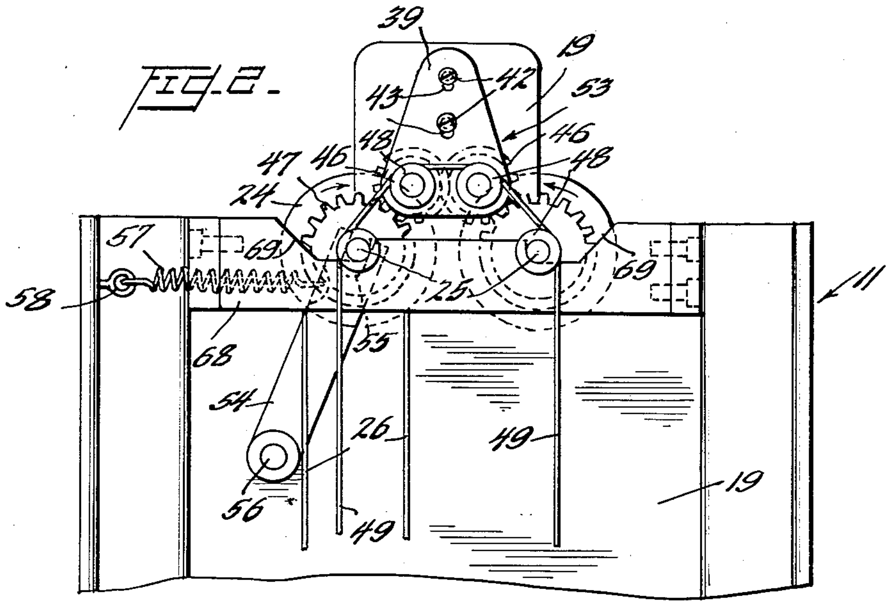
FIG. 2 is a fragmentary end view of the apparatus taken along the line 2—2 of FIG. 1 viewed in the direction of the arrows.
Figures 4, 5:
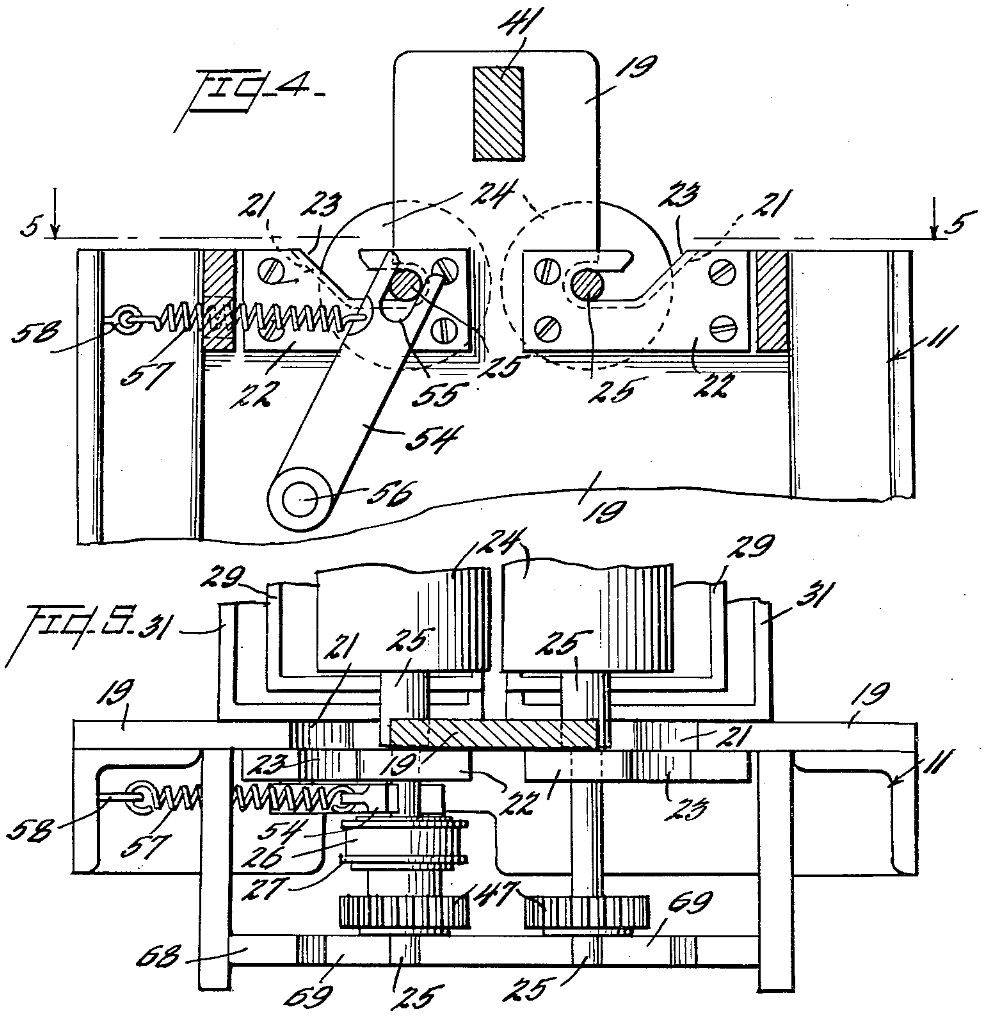
FIG. 4 is a fragmentary vertical section taken along the line 4—4 of FIG. 1 viewed in the direction of the arrows.
FIG. 5 is a horizontal sectional view of an end portion of the apparatus taken along the line 5—5 of FIG. 4 viewed in the direction of the arrows.

The general construction of the apparatus is best illustrated in FIGS. 1 and 2 wherein opposed end plates 19—19 are provided with horizontally elongated aligned open-ended slots 21—21. For assembly of the apparatus cover plates 22—22, best shown in FIGS. 1, 4, and 5, provided with slots 23—23 are designed to overlay the slots 21—21 to close partially the open ends of the last-mentioned slots. An elongated roller 24 is supported for rotation about its axis by spindles 25—25 of stepped diameters, which spindles are received loosely in the slots 21—21 and 23—23 for approximately horizontal translatory movement in a direction toward and away from the longitudinal centerline of the machine. The elongated roller 24 of FIG. 1 is driven rotatively by means of a vertically extending belt 26 which cooperatively engages a pulley 27 keyed to one of the spindles 25—25 and over a pulley 28 which is positioned vertically below the pulley 27 in a vertical plane containing the pulley 27. The pulley 28 is connected drivingly to gear shaft 18 for rotation by the motor 13.

An elongated, open tank 29 of rectangular configuration is shown in FIG. 1 in a position immediately below the axis of the elongated roller 24 and spaced vertically therefrom by a distance which will permit the roller 24 to penetrate into the tank 29 to a depth less than the radius of the roller 24. The tank 29 is designed to contain a bath of liquid coating material, such as molten solder, and is mounted within a trough 31. The trough 31 is supported beneath the tank 29 by fasteners 32—32 secured to the end plates 19—19.

As viewed in FIG. 1, a wiper 33 composed of an absorbent material, such as felt or the like, is located immediately above the roller 24 in a position to wipe the surface of a printed wire board 34, on which is mounted a printed circuit 35, as the board passes by the wiper 33 on a downward pass toward the roller 24. The wiper 33 in FIG. 1 is in a position to have wiped the surface of board 34 opposite to that surface shown. The wiper 33 protrudes laterally from the bottom of an open receptacle 36 and serves as a wick to conduct a solder flux in liquid form from the receptacle 36 to the face of the printed wire board 34. As best shown in FIG. 1, the open receptacle 36 is engaged fixedly to the end plates 19—19 by suitable fasteners 37—37. Guide members 38—38 are held on the end plates 19—19 in aligned horizontally opposed relation and above the wiper 33 for introducing a printed wire board into correct alignment for processing through the machine.

In FIG. 1 hangers 39—39 are depicted in vertical planes which are spaced horizontally and parallel with respect to end plates 19—19 by means of spacer members 41—41 to which hangers 39—39 are attached supportingly by fasteners 42—42. The fasteners 42—42 are received through apertures 43—43 which are of a size to permit vertical movement of the hangers 39—39. In this fashion all elements attached to the hangers 39—39 are mounted for vertical movement with the hangers 39—39. Openings 44—44 are provided in the hangers 39—39 for supportingly and respectively receiving arbors 45—45 of pinions 46—46.

Pairs of pinions 46—46, FIG. 2, located at each end of the machine are designed to rotate on the arbors 45—45 in meshing engagement with each other, and with gears 47—47 which are designed for rotation with the spindles 25—25 of the rollers 24—24.

As heretofore mentioned, rollers 24—24, as shown in FIG. 2, are mounted in slots 21—21 of opposed end plates 19—19 and slots 23—23 of cover plates 22—22 for rotational and translational movement. When the rollers 24—24 are caused to move horizontally in the mentioned slots, the pinions 46—46, carried on arbors 45—45 which are supported by hangers 19—19, are forced to move in a vertical direction to enable the rollers 24—24 to adjust spacially.

Small sheaves 48—48 are shown in FIGS. 1 and 2 attached coaxially for rotation on each of the arbors 45—45, respectively, and to each of the spindles 25—25 at each end of the machine in vertical planes parallel to and located without the hangers 19—19. The sheaves 48—48 are designed for the purpose of changing the direction of cables 49—49 which dependingly support counterpoise weights 51—51. Anchor brackets 52—52, or the like, are provided near the base plate 12, for example, to which the respective ends opposite the weighted ends of cables 49—49 are attached.

Referring now to FIG. 2, wherein opposed rollers 24—24 are shown in assembled position, floatingly mounted gearing 53 which, in cooperation with the counterpoise weights 51—51 of FIG. 1 and the cables 49—49, biases the rollers 24—24 toward each other in a manner such that a uniform pressure of the rollers 24—24 is maintained against printed wire boards under process.

The cables 49—49 normally exert a downward force because of the counterpoise weights 51—51 being hung one on the free end of each cable with the other end of each cable joined to an anchor bracket 52 located below the sheaves 48—48; however, the individual cable 49 at each side of the machine is rove over each of four sheaves 48—48. Since those sheaves 48—48 which are attached coaxially to the arbors 45—45 are spaced above and inwardly with respect to those sheaves 48—48 coaxially attached to the spindles 25—25, the downward forces exerted by the counterpoise weights 51—51 on the cables 49—49 are changed in direction so as to bias the rollers 24—24 toward each other. The spindles 25—25 at the ends of each roller 24 are caused to move horizontally within the slots 21—21 and 23—23 by exertion of this inwardly directed force on the sheaves 48—48 which are coaxially fixed on the spindles 25—25.

An elongated rocker arm 54 having a U-shaped terminal slot 55 provided at one extremity thereof is supported pivotally on one of the end plates 19—19 by means of a pivot pin 56. The pivot pin 56 is fastened to a single end plate 19 at a point subjacent the particular spindle 25 which is driven through the pulley 27. The terminal slot 55 is arranged to receive this spindle 25. A tension spring 57, fastened by means such as an eye bolt 58 to the legged stand 12, normally urges the arm 54 arcuately to pivot in a counterclockwise direction, as viewed in FIG. 2, toward a vertical position. In this fashion the force exerted by the counterpoise weights 51—51 on the spindles 25—25 is damped by the tension of the spring 57. The rocker arm 54 enables the rollers 24—24 to pass between them the printed wire boards 15—15, or the like, of different thicknesses in a smooth manner. The manner in which the rollers 24—24 move apart upon reception therebetween of an article under process is illustrated best in FIGS. 2 and 3.

Figure 3:
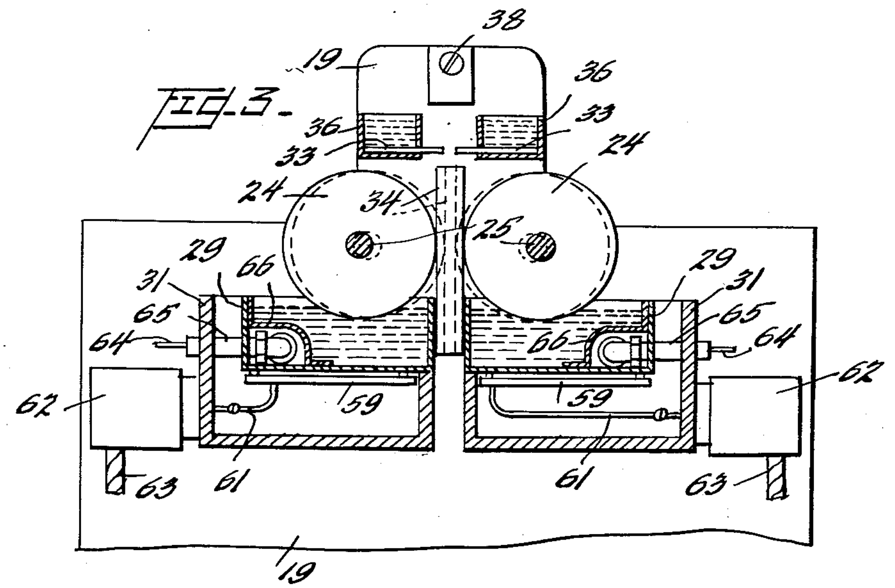
FIG. 3 is a fragmentary vertical section taken along the line 3—3 of FIG. 1 viewed in the direction of the arrows.

The end plate 19 is shown in FIG. 3 supporting the troughs 31—31 within which are supported the tanks 29—29. Liquids to be contained within the tanks 29—29 are heated by means of heater strips 59—59 which are disposed immediately beneath the tanks 29—29. Heater coils, not shown, within the heater strips 59—59, are coupled electrically to a current source, not shown, by wires 61—61 which are fed to the interior of the troughs 31—31 through connectors 62—62 mounted on the exterior of the troughs 31—31 to receive electrical conduits 63—63.

The control of the temperature of liquids to be contained within the tanks 29—29 is accomplished through the use of thermostat leads 64—64, FIG. 3, which are carried within pipes 65—65 through the walls of the troughs 31—31 and the walls of the tanks 29—29. The thermostat leads 64—64 are sealed from the liquids to be contained within the tanks 29—29 by shields 66—66, and the temperature within the area of the tanks 29—29 surrounding the thermostat leads 64—64 is reflected on conventional temperature gauges, not shown, appurtenant to the machine. The operation of the thermostat is controlled by a control unit 67, FIG. 1, conveniently positioned on base plate 12 of the legged stand 11. The control unit 67 is connected conventionally with the wires 61—61 leading to coils of the heater strips 59—59 so as automatically to maintain a desired temperature for liquids to be contained in each of the tanks 29—29.

Figure 6:
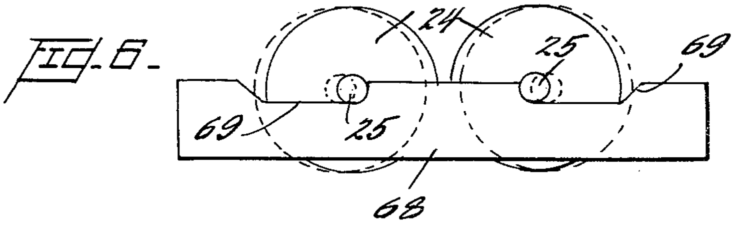
FIG. 6 is a detail elevational view of a shaft bearing plate supporting the shafts of rollers shown in assembled condition in FIGS. 2 and 5.

In FIG. 5 there is best shown the terminal support of roller spindles 25—25 and gears 47—47. An outer bearing plate 68 formed with slots 69—69, FIG. 6, provides an outer support for the end portion of each spindle 25 of rollers 24—24. The slots 69—69 are open-topped in order that the rollers 24—24 may be removed vertically without obstruction. The rollers 24—24 therefore may be extracted from assembled positions merely by uncoupling the continuous drive belt 26, subsequently urging the rollers 24—24 outwardly within the respective bearing slots 21—21, 23—23, and 69—69 from the center of the machine, and lifting the rollers upwardly.

*Operation*

Printed wire boards, such as the board 34 of FIG. 1, which normally are composed of electrically non-conductive material and upon which are mounted printed circuits to be given a solder coating, are fed manually through the guide members 38—38 downwardly between the two wipers 33—33. As the board 34 passes the wipers 33—33, flux is applied to the opposite surfaces of the board 34. The gravity feed of the board 34 past the wipers 33—33 next causes the board 34 to pass between the pair of rollers 24—24 which adjust horizontally so as to apply a pressure uniformly against the board surfaces contacted.

Each of the rollers 24—24 is immersed partially in molten solder contained within the tanks 29—29, and since each of the rollers 24—24 preferably is constructed of material which contains a high amount of silicon such as Armco iron in order to be capable of retention of a good solder coating under prolonged heat, the molten solder is carried uniformly on the rollers 24—24 for deposit on the surfaces of the printed wire board 34.

Inasmuch as the circuit 35 mounted on the board 34 is solderable and the composition of the board 34 is not, the molten solder picked up by the rollers 24—24 which press against the board 34 will coat only the circuit 35. The board 34, having once passed through the path between the rollers 24—24, may be received by an operator who may stack the successively processed boards on the base plate 12, for example, FIG. 1, boards 15—15.

Since the opposed rollers 24—24 are provided with floatingly mounted gearing 53 and urging means such as cables 49—49 structurally and functionally interrelated thereto, it is possible to achieve application of uniform pressure against surfaces of boards, sheets, or other substantially planar articles passed between the rollers. A thin coating of solder is applied by the rollers 24—24 to any solderable material supported upon the surfaces of the articles processed.

The apparatus hereinabove described has been found desirable in the application of a smooth coating of solder of uniform thickness on all exposed small surfaces of a circuit, for example, such that connections of electrical components to the solder coated circuit subsequently may be made by a mass production dip process whereby the solder of the coating is heated just enough to melt. In this manner the adhesive bond which holds the printed circuit to the board is not broken by overheating occasioned in direct soldering techniques.

It is to be understood that the above-described apparatus is simply illustrative of the application of the principles of the invention. For example, etched circuit boards as well as printed wire boards are particularly suitable for receiving the coatings applicable by operation of the apparatus. Numerous other arrangements may be devised readily by those skilled in the art without departing from the spirit and scope of the invention.

What is claimed is:

1. An apparatus for applying solder coatings to solderable matter mounted on insulation boards comprising a pair of fixedly held longitudinally-opposed tanks for containing solder in liquid state, a pair of longitudinally-opposed elongated rollers rotatably and translatably supported one above each tank and projecting therein, a pair of longitudinally opposed elongated receptacles fixedly held one above each of said rollers, each receptacle being provided with an elongated flexible wick extending from within the receptacle for application of flux contained in the receptacle to the surface of a board passed downwardly between the rollers, drive means operatively engaged to one roller to rotate the one roller, gear means coupling the one roller to the other to impart rotation thereto, the gear means being mounted for translatory and rotational movement, a pair of cables having free ends, weights attached to each of the free ends of the cables, each cable supportingly depending over the extremities of the rollers to urge yieldingly each roller longitudinally toward the other so as to adjust automtically to contact surfaces of boards of different thicknesses passed between the rollers, and dampening means connected to the one roller being driven to enable the rollers to adjust longitudinally without shock.

2. An apparatus for applying solder coatings to solderable matter mounted on insulation boards comprising a pair of fixedly held longitudinally-opposed tanks for containing solder in liquid state, a pair of longitudinally-opposed elongated rollers rotatably and translatably supported one above each tank and projecting therein, a pair of longitudinally-opposed elongated receptacles fixedly held above each of said rollers, each receptacle being provided with an elongated flexible wick extending from within the receptacle for application of flux contained in the receptacle to the surface of a board passed downwardly between the rollers, drive means operatively engaged to one roller to rotate the one roller, gear means coupling the one roller to the other to impart rotation thereto, the gear means being mounted for translatory and rotational movement, a pair of cables having free end, weights attached to each of the free ends of the cables, each cable supportingly depending over the extremities of the rollers to urge yieldingly each roller longitudinally toward the other so as to adjust automatically to contact surfaces of boards of different thicknesses passed between the rollers, and a spring-biased rocker arm pivotally connected to the one roller being driven to enable the rollers to adjust longitudinally without shock.

3. An apparatus for applying solder coatings to solderable matter mounted on insulation boards comprising a pair of fixedly held longitudnially opposed tanks for containing solder in a liquid state, a pair of longitudinally opposed elongated rollers rotatably and translatably supported one above each tank and projecting therein, a pair of longitudinally opposed elongated receptacles fixedly held above each of said rollers, each receptacle being provided with an elongated flexible wick extending from within the receptacle for application of flux contained in the receptacle to the surface of a board passed downwardly between the rollers, a pair of cables having free ends, weights attached to each of the free ends of the cables, each cable supportingly depending over the extremities of the rollers to urge and move each roller longitudinally toward the other so as to adjust automatically to contact surfaces of boards of different thicknesses passed between the rollers, and means connected to said rollers for dampening the motion of the rollers when said rollers are moved by said weights and cables.

4. An apparatus for applying coating material to workpieces having varying thicknesses, which comprises a pair of coating rollers having axial shafts extending from the ends of the rollers and having said coated material on the surface of said rollers, a cable extending over the ends of the shafts, means attached to the ends of the cable for applying a tension to the cable and for urging said shafts and rollers relatively together whereby said rollers adjust automatically to said workpieces having varying thicknesses, and resilient means connected to said coating rollers and in opposition to the tensioned cable for dampening the motion of the coating rollers when said rollers are moved apart by the passage of a workpiece between the rollers.

5. An apparatus for applying coating material to workpieces having varying thicknesses, which comprises reservoir means for holding a supply of said coating material, a pair of coating rollers having axial shafts extending from the ends of the rollers and mounted with respect to said reservoir means such that portions of said rollers extend into the coating material contained in the reservoir, a cable extending over the ends of the shafts, means attached to the ends of the cable for applying a tension to the cable and for urging both of said shafts and rollers relatively together whereby said rollers adjust automatically to said workpieces having varying thicknesses, and a spring-biased rocker arm pivotally connected to one of said coating rollers for applying a force thereto in opposition to the tensioned cable whereby said rollers are moved apart by the passage of a workpiece between the rollers.

6. In an apparatus for coating articles, a pair of coating rollers, guide means for mounting said rollers for relative translatory movement toward and away from each other, a first pair of spaced gears connected respectively to said pair of rollers, a second pair of meshing gears, means for mounting said second pair of gears to move between and into mesh with said first pair of gears, and means for urging said first pair of gears toward each other and said second pair of gears into mesh with said first pair of gears whereby said rollers are urged to move toward each other in said guide means.

7. In an apparatus for coating articles, a pair of coating rollers, guide means for mounting said rollers for relative translatory movement toward and away from each other, a first pair of spaced gears connected respectively to said pair of rollers, a second pair of meshing gears, means for mounting said second pair of gears to move between and into mesh with said first pair of gears, means for urging said first pair of gears toward each other and said second pair of gears into mesh with said first pair of gears whereby said rollers are urged to move toward each other in said guide means, means on said guide for limiting the movement of said rollers toward each other to preclude meshing of said first pair of gears, and shock absorbing means opposing said relative translatory movement of said rollers in said guide means.

References Cited in the file of this patent

UNITED STATES PATENTS

| | | |
|---|---|---|
| 326,688 | Sparks | Sept. 22, 1885 |
| 498,120 | Jones | May 23, 1893 |
| 500,718 | Norten et al. | July 4, 1893 |
| 842,031 | Slocomb | Jan. 22, 1907 |
| 1,327,299 | Vavra | Jan. 6, 1920 |
| 1,432,733 | Reed | Oct. 17, 1922 |
| 1,523,527 | Heidinger | Jan. 20, 1925 |
| 1,707,611 | Hamburger et al. | Apr. 2, 1929 |
| 2,552,245 | Wilckens | May 8, 1951 |
| 2,681,864 | Legat | June 22, 1954 |

FOREIGN PATENTS

| | | |
|---|---|---|
| 826,427 | Germany | Jan. 3, 1952 |

OTHER REFERENCES

Andrews: Tele-Tech and Electronic Industries, December 1954, article on pages 75 and 146 to 149. (Copy in Div. 25.)

UNITED STATES PATENT OFFICE
CERTIFICATE OF CORRECTION

Patent No. 3,006,318 October 31, 1961

Raymond Monroe, Jr., et al.

It is hereby certified that error appears in the above numbered patent requiring correction and that the said Letters Patent should read as corrected below.

Column 1, line 14, for "in" read -- on --; line 26, before "afford" insert -- usually --; column 2, line 46, for "An elongated roller 24 is" read -- A pair of elongated rollers 24-24 are --; line 47, for "its axis" read -- their axes --; line 60, for "FIG. 1" read -- FIGS. 1 and 3 --; line 61, for "axis of the elongated roller 24" read -- axes of the elongated rollers 24-24 --; lines 63 and 64, for "roller 24", each occurrence, read -- rollers 24-24 --; line 70, for "FIG. 1" read -- FIGS. 1 and 3 --; same column 2, line 72, and column 3, line 3, for "roller 24", each occurrence, read -- rollers 24-24 --.

Signed and sealed this 15th day of September 1964.

(SEAL)
Attest:

ERNEST W. SWIDER
Attesting Officer

EDWARD J. BRENNER
Commissioner of Patents